United States Patent
Aizawa

(10) Patent No.: US 7,841,911 B2
(45) Date of Patent: Nov. 30, 2010

(54) JOINT PART AND A WIRING HARNESS USING THE SAME

(75) Inventor: Takeshi Aizawa, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/085,198

(22) PCT Filed: Nov. 24, 2006

(86) PCT No.: PCT/JP2006/323436
§ 371 (c)(1),
(2), (4) Date: May 19, 2008

(87) PCT Pub. No.: WO2007/061046
PCT Pub. Date: May 31, 2007

(65) Prior Publication Data
US 2009/0170356 A1    Jul. 2, 2009

(30) Foreign Application Priority Data
Nov. 25, 2005    (JP)    ............................. 2005-339741
Mar. 16, 2006    (JP)    ............................. 2006-072138

(51) Int. Cl.
*H01R 11/09*    (2006.01)
(52) U.S. Cl. ...................................... 439/723; 439/949
(58) Field of Classification Search ................ 439/723, 439/724, 949, 92, 108, 130, 76.2
See application file for complete search history.

(56) References Cited

U.S. PATENT DOCUMENTS

| 4,064,420 | A | * | 12/1977 | Yuda et al. | .................. 318/776 |
| 4,255,789 | A | * | 3/1981 | Hartford et al. | ............. 701/108 |
| 4,471,739 | A | * | 9/1984 | Yamato et al. | .............. 123/479 |

(Continued)

FOREIGN PATENT DOCUMENTS

DE    42 17 278 A1    12/1992

(Continued)

OTHER PUBLICATIONS

German Office Action issued Jun. 10, 2010 for German Application No. 11 2006 003 140.6-34 (with translation).

*Primary Examiner*—T C Patel
*Assistant Examiner*—Vladimir Imas
(74) *Attorney, Agent, or Firm*—Oliff & Berridge PLC

(57) ABSTRACT

A joint part which allows connection work to be easily performed and a wiring harness using the same. A joint part A has a housing (60) including a first joint portion (10) arranged to make a concurrent connection of ends of electric wires drawn from positive terminals of a plurality of igniters (3) and positive terminals of a plurality of injectors (4) and an end of an electric wire drawn from a positive terminal of a power supply (5) for the igniters (3) and the injectors (4), a second joint portion (20) arranged to make a concurrent connection of ends of electric wires drawn from negative terminals of the igniters (3), and a ground terminal (40) to which the first joint portion (10) is connected via a noise filter (50), and the second joint portion (20) is directly connected.

16 Claims, 17 Drawing Sheets

U.S. PATENT DOCUMENTS

| | | | |
|---|---|---|---|
| 4,476,709 A * | 10/1984 | Hattori et al. | 73/35.05 |
| 4,929,196 A | 5/1990 | Ponn et al. | |
| 5,127,382 A * | 7/1992 | Imoehl | 123/470 |
| 5,219,305 A | 6/1993 | Kawaguchi et al. | |
| 5,390,648 A * | 2/1995 | Yanase | 123/634 |
| 5,470,253 A * | 11/1995 | Siems et al. | 439/491 |
| 5,506,123 A * | 4/1996 | Chieffalo et al. | 439/139 |
| 5,565,712 A * | 10/1996 | Gaviani et al. | 307/10.1 |
| 5,669,367 A * | 9/1997 | Sawazaki et al. | 123/635 |
| 5,771,850 A * | 6/1998 | Okada | 123/143 C |
| 5,996,543 A * | 12/1999 | Nakayama et al. | 123/184.21 |
| 6,240,903 B1 * | 6/2001 | Kurozumi | 123/472 |
| 6,408,811 B1 * | 6/2002 | Glovatsky et al. | 123/184.61 |
| 6,513,479 B2 * | 2/2003 | Nozaki et al. | 123/198 E |
| 6,688,917 B2 | 2/2004 | Ushio et al. | |
| 6,712,052 B2 * | 3/2004 | Itoh | 123/647 |
| 6,718,253 B1 * | 4/2004 | Wellnhofer et al. | 701/108 |
| 6,878,017 B2 | 4/2005 | Sakurai et al. | |
| 6,988,483 B1 * | 1/2006 | Hagari | 123/406.16 |
| 7,092,814 B1 * | 8/2006 | Trenne et al. | 701/105 |
| 7,355,292 B2 * | 4/2008 | Yamashita | 290/40 C |
| 2001/0052334 A1 * | 12/2001 | Nozaki et al. | 123/198 E |
| 2004/0132349 A1 | 7/2004 | Sakurai et al. | |
| 2005/0026480 A1 | 2/2005 | Fujii et al. | |
| 2005/0079774 A1 | 4/2005 | Fujii et al. | |

FOREIGN PATENT DOCUMENTS

| | | |
|---|---|---|
| DE | 102 50 628 A1 | 5/2003 |
| DE | 103 52 403 A1 | 6/2004 |
| JP | U-2-46387 | 3/1990 |
| JP | A-3-71577 | 3/1991 |
| JP | A-11-40281 | 2/1999 |
| JP | A-2004-179032 | 6/2004 |
| JP | A-2004-192991 | 7/2004 |
| JP | A-2005-116472 | 4/2005 |

\* cited by examiner

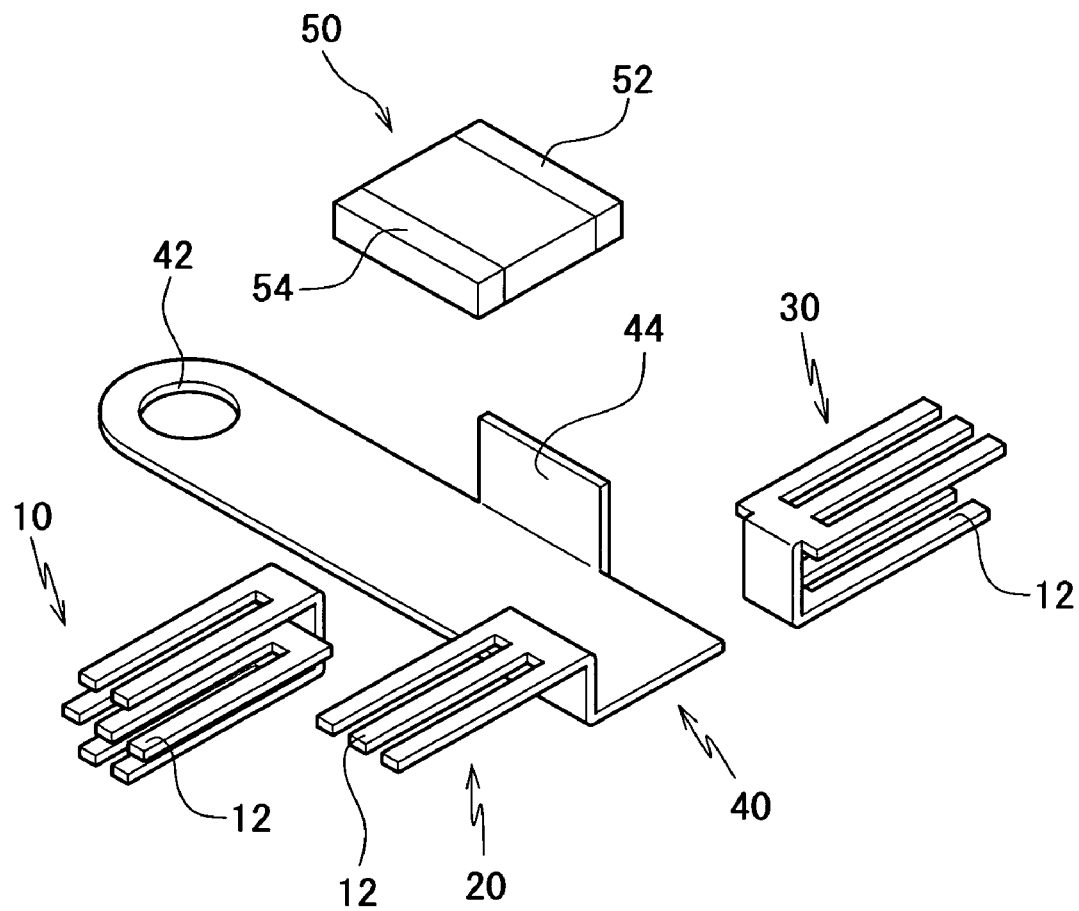
F I G. 6

US 7,841,911 B2

JOINT PART AND A WIRING HARNESS USING THE SAME

TECHNICAL FIELD

The present invention relates to a joint part and a wiring harness using the same, and specifically relates to a joint part suitably used for wiring connections around an engine of an automobile and a wiring harness using the same.

BACKGROUND ART

In recent years, an engine control system which makes a computer compute the amount of fuel injection and the ignition timing based on operating conditions and controls ignition mechanisms (e.g., igniters) and fuel injection mechanisms (e.g., injectors) so as to develop spark discharge at a spark plug of each cylinder is widely used in an automobile.

FIG. 16 shows a schematic circuit diagram of wiring of such an engine control system. In general, an engine intended for automobile use is multicylinder, of which each cylinder has an igniter 3, an injector 4, and other mechanisms. The igniters 3 and the injectors 4 are in parallel connection with a power supply 5 arranged to supply electric power to them via electric wires.

Because the igniters 3 are applied with high pulse voltage, noise is apt to be generated especially in the igniters 3. Therefore, a noise filter 50 is generally provided to the wiring between the igniters 3 and the power supply 5.

In addition, the igniters 3 and the injectors 4 are connected also to an engine control computer 6 (hereinafter, referred to as an ECU) arranged to control the ignition timing of each of the igniters 3 and the amount of fuel injection of each of the injectors 4 via electric wires.

The plurality of electric wires drawn from the igniters 3, the injectors 4, and other mechanisms, and a plurality of electric wires arranged to connect a variety of electronic or electrical devices mounted in an engine room of an automobile are tied in a bundle and are routed through the engine room in the state of a wiring harness. The tying and connection of the plurality of electric wires drawn from the igniters 3, the injectors 4, and other mechanisms are conventionally made in the following manner.

As shown in FIG. 17, sheaths at ends of a plurality of electric wires 100 are striped off, and the ends of the electric wires 100 are put together and welded by ultrasonic welding or resistance welding. Then, the welded end of the electric wires 100 is inserted into a cap 102 made of a resin, and a resin 104 such as an epoxy resin is injected in the cap 102 in order to waterproof the ends of the electric wires 100.

A connection between the electric wires thus tie and connected and the noise filter provided in the engine room is made by routing the electric wires to the noise filter.

In addition, a connection of the electric wires to a ground such a car body is made by routing the electric wires to the ground. This connection work is to be made for each bundle of the electric wires.

As a prior art literature relating to the present invention, Japanese Patent Application Unexamined Publication No. 2004-192991, Japanese Patent Application Unexamined Publication No. 2004-179032, and Japanese Patent Application Unexamined Publication No. Hei11-40281 are cited.

DISCLOSURE OF THE INVENTION

Problem to be Solved by the Invention

There is a problem that the connection work mentioned above is not only very complicated but also difficult to automate, and it should be done by hand. There is another problem that a time for hardening the epoxy resin is required. Thus, connection workability is impaired.

An object of the present invention is to overcome the problems described above and to provide a joint part which allows connection work to be easily performed. Another object of the present invention is to provide a wiring harness using the same.

Means for Solving Problem

To achieve the objects and in accordance with the purpose of the present invention, a joint part according to claim 1 has a housing including a first joint portion arranged to make a concurrent connection of ends of electric wires drawn from positive terminals of a plurality of ignition mechanisms and positive terminals of a plurality of fuel injection mechanisms and an end of an electric wire drawn from a positive terminal of a power supply for the mechanisms, a second joint portion arranged to make a concurrent connection of ends of electric wires drawn from negative terminals of the ignition mechanisms, and a ground terminal to which the first joint portion is connected via a noise filter and the second joint portion is directly connected.

In addition, a joint part according to claim 2 has a housing including a first joint portion arranged to make a concurrent connection of ends of electric wires drawn from positive terminals of a plurality of ignition mechanisms and positive terminals of a plurality of fuel injection mechanisms and an end of an electric wire drawn from a positive terminal of a power supply for the mechanisms, and a second joint portion arranged to make a concurrent connection of ends of electric wires drawn from negative terminals of the ignition mechanisms and an end of an electric wire drawn from a ground, the second joint portion being connected to the first joint portion via a noise filter.

In the joint part according to claim 1 or 2, it is preferable that the housing further includes a third joint portion arranged to make a concurrent connection of ends of electric wires which transmit returned signals for control signals inputted to the ignition mechanisms from a control device arranged to control the ignition timing of the ignition mechanisms.

It is preferable that at least the noise filter is subjected to enveloped casting of a resin to be molded.

A wiring harness according to the present invention has the joint part according to claim 1 or 2.

EFFECT OF THE INVENTION

In the joint part according to claim 1, because the joint part has the housing including the first joint portion arranged to make the concurrent connection of the ends of the electric wires drawn from the positive terminals of the ignition mechanisms and the positive terminals of the fuel injection mechanisms and the end of the electric wire drawn from the positive terminal of the power supply for the mechanisms, the second joint portion arranged to make the concurrent connection of the ends of the electric wires drawn from the negative terminals of the ignition mechanisms, and the ground terminal to which the first joint portion is connected via the noise filter and the second joint portion is directly connected, conventional complicated work of putting together and connecting the ends of the electric wires for the connection of the ignition mechanisms and the fuel ignition mechanisms to the power supply, for example in an engine control system of an automobile, becomes unnecessary, so that connection work is simplified.

In addition, because the noise filter connected between the first joint portion and the ground terminal is also included in the housing, work of routing and connecting the electric wires to the noise filter also becomes unnecessary, so that connection workability is improved.

In addition, because the ground terminal used for a connection to a ground such as a car body is also included in the housing, the connection to the ground such as the car body is facilitated, so that the connection work is further simplified.

In the joint part according to claim 2, because the joint part has the housing including the first joint portion arranged to make the concurrent connection of the ends of the electric wires drawn from the positive terminals of the ignition mechanisms and the positive terminals of the fuel injection mechanisms and the end of the electric wire drawn from the positive terminal of the power supply for the mechanisms, and the second joint portion arranged to make the concurrent connection of the ends of the electric wires drawn from the negative terminals of the ignition mechanisms and the end of the electric wire drawn from the ground, the second joint portion being connected to the first joint portion via the noise filter, conventional complicated work of putting together and connecting the ends of the electric wires for the connection of the ignition mechanisms and the fuel ignition mechanisms to the power supply becomes unnecessary, so that connection work is simplified.

In claim 2, though the ground terminal is not included in the housing in contrast to claim 1, the ends of the electric wires connected to the ground is brought into a concurrent connection to the second joint portion, so that there is no disadvantage to the connection to the ground such as the car body. In other words, the electric wires drawn from the negative terminals of the ignition mechanisms can be brought into a concurrent connection to the ground, and even if a space for the joint part cannot be obtained close to the ground such as the car body, the second joint portion can be connected to the ground, so that connection work is simplified.

In addition, because the first joint portion and the second joint portion connected via the noise filter which suppresses noise generation by the ignition mechanisms are included in the housing also in claim 2, work of connecting the ends of the electric wires to the noise filter becomes unnecessary, so that connection workability is further improved.

In the joint part according to claim 1 or 2, if the third joint portion is further included in the housing, conventional complicated connection work of welding and waterproofing the ends of the electric wires also becomes unnecessary in the wiring of the engine control system of the automobile. In addition, because not only the first joint portion and the second joint portion but also the third joint portion are incorporated into one housing, the number of components required in the wiring can be reduced in contrast to the case of using a joint part having only the third joint portion.

If the noise filter included in the housing is subjected to enveloped casting of a synthetic resin material to be molded, the noise filter can be protected from extraneous moisture, and stable capability of noise removal can be permanently offered.

In the wiring harness having the joint part according to claim 1 or 2, connections for providing wiring of the engine control system for the automobile or routing of the electric wires in an engine room can be smoothly performed, so that connection work can be made more efficient and productivity of automobiles can be improved.

BRIEF DESCRIPTION OF THE DRAWINGS

FIG. 6 is a diagram showing the state of the joint part B before assembled;

BEST MODE FOR CARRYING OUT THE INVENTION

Figure 1:
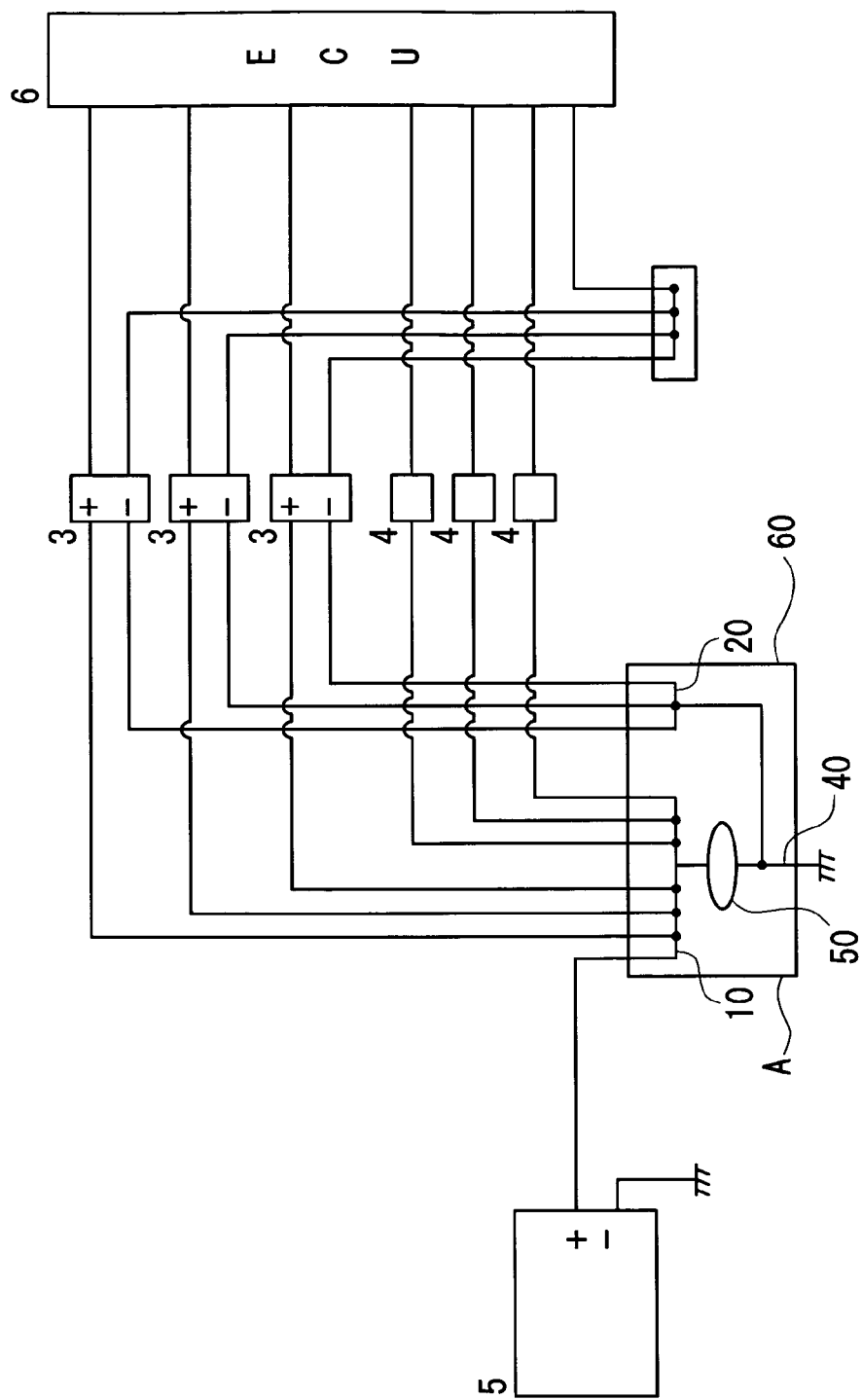
FIG. 1 is a schematic circuit diagram of an engine control system intended for automobile use in which a joint part A according to a first preferred embodiment of the present invention is used.

A detailed description of a first preferred embodiment of the present invention will now be given with reference to FIGS. 1 to 4. FIG. 1 is a schematic circuit diagram showing an example of wiring of an engine control system intended for automobile use in which a joint part A according to the first preferred embodiment of the present invention is used.

As shown in FIG. 1, a generally used engine control system of an automobile has a plurality of igniters 3 as ignition mechanisms, a plurality of injectors 4 as fuel injection mechanisms, a power supply 5 arranged to supply electric power to the igniters 3 and the injectors 4, and an ECU (an engine control computer) 6 arranged to compute the amount of fuel injection and the ignition timing based on operating conditions of an engine so as to control the igniters 3 and the injectors 4.

The igniters 3 and the injectors 4 are both connected to the ECU 6 via electric wires. To the igniters 3 and the injectors 4, signals for controlling the ignition timing of the igniters 3 and signals for controlling the amount of fuel injection of the injectors 4 are transmitted from the ECU 6 through the electric wires.

The igniters 3 and the injectors 4 are connected to the power supply 5 via the joint part A according to the first preferred embodiment of the present invention. The joint part A has a housing 60 made of an insulted synthetic resin material in which a first joint portion 10, a second joint portion 20, a ground terminal 40, and a noise filter 50 are included.

The first joint portion 10 has the function of making a concurrent connection of an electric wire drawn from a positive terminal of the power supply 5 and electric wires drawn from positive terminals of the igniters 3 and the injectors 4. The second joint portion 20 has the function of making a concurrent connection of electric wires drawn from negative terminals of the igniters 3.

The first joint portion 10 is connected to the ground terminal 40 via the noise filter 50, and the second joint portion 20 is directly connected to the ground terminal 40. The ground terminal 40 is connected to a ground such as a car body via screws.

Figure 2:
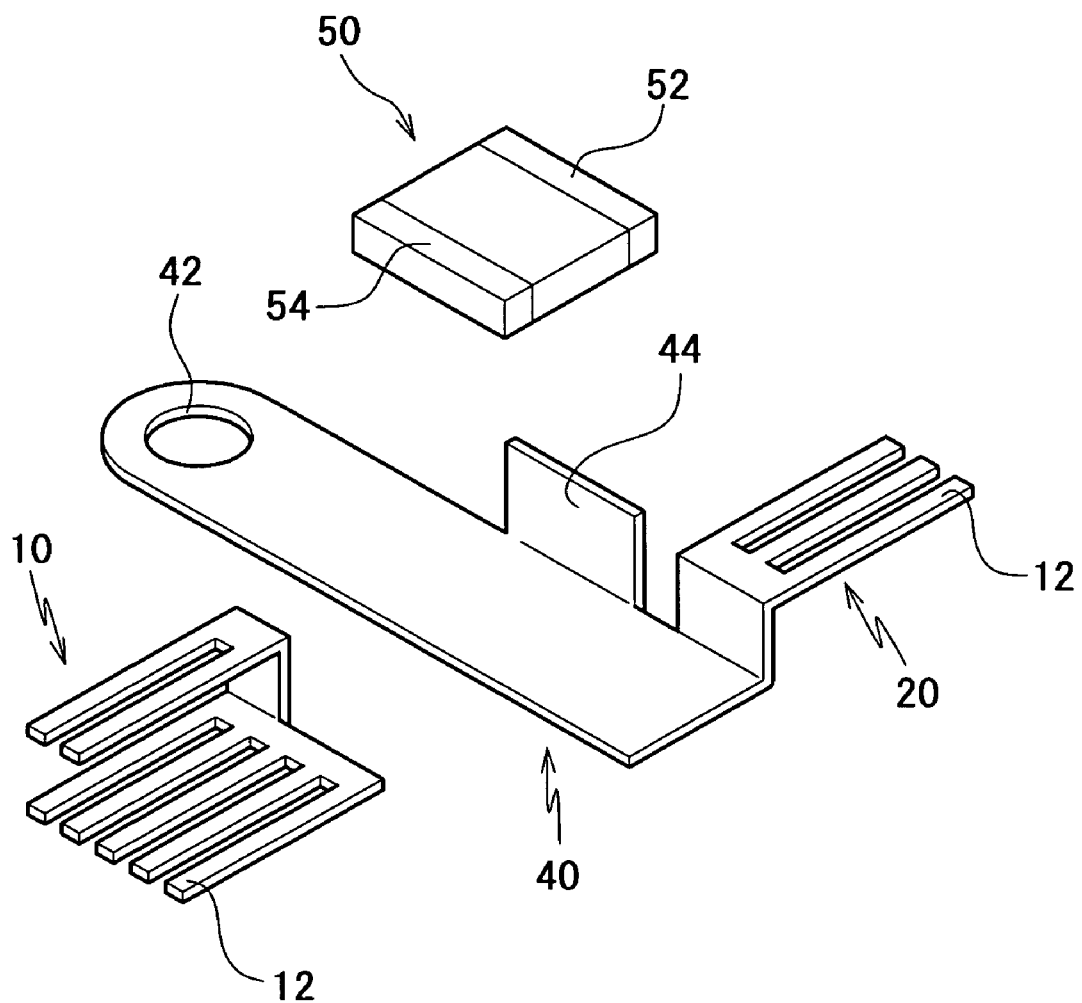
FIG. 2 is a diagram showing the state of the joint part A before assembled.
Figure 3:
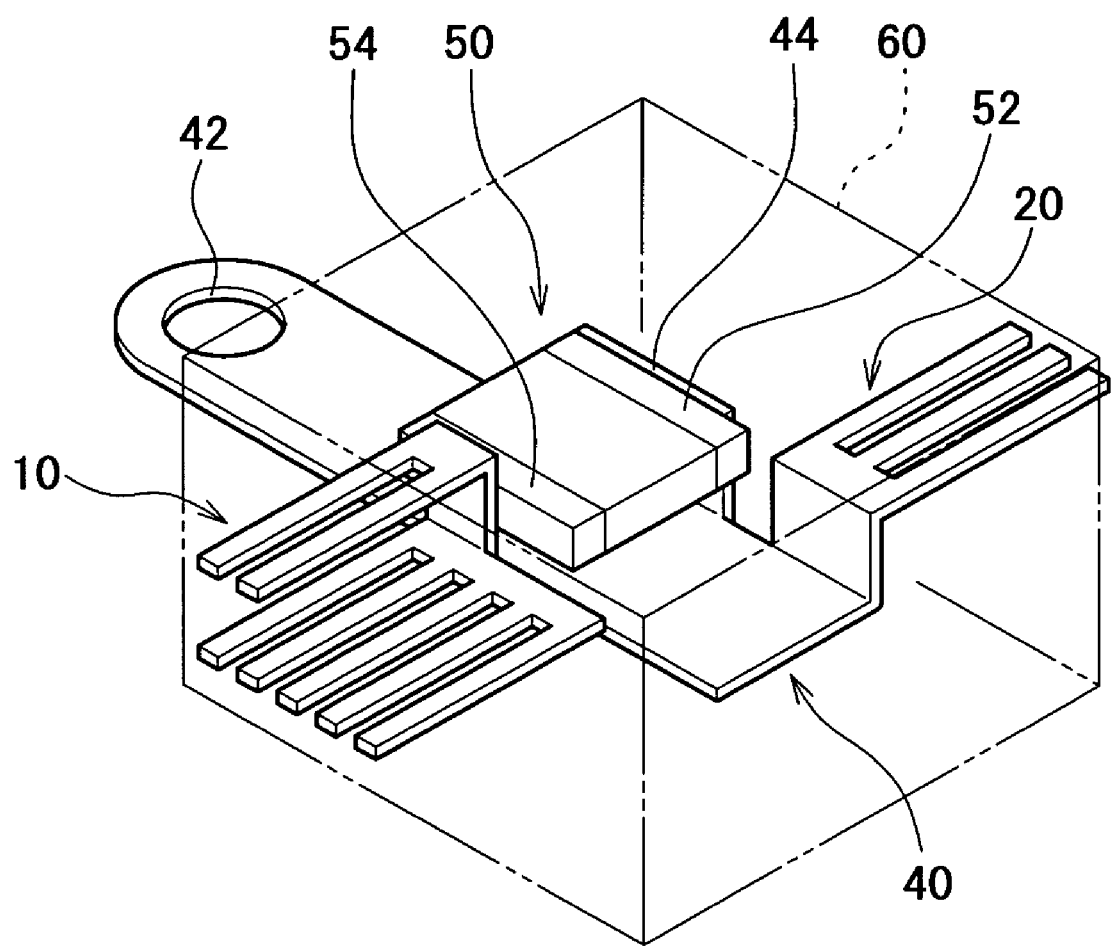
FIG. 3 is a schematic diagram showing the state of the joint part A after assembled.
Figure 4:
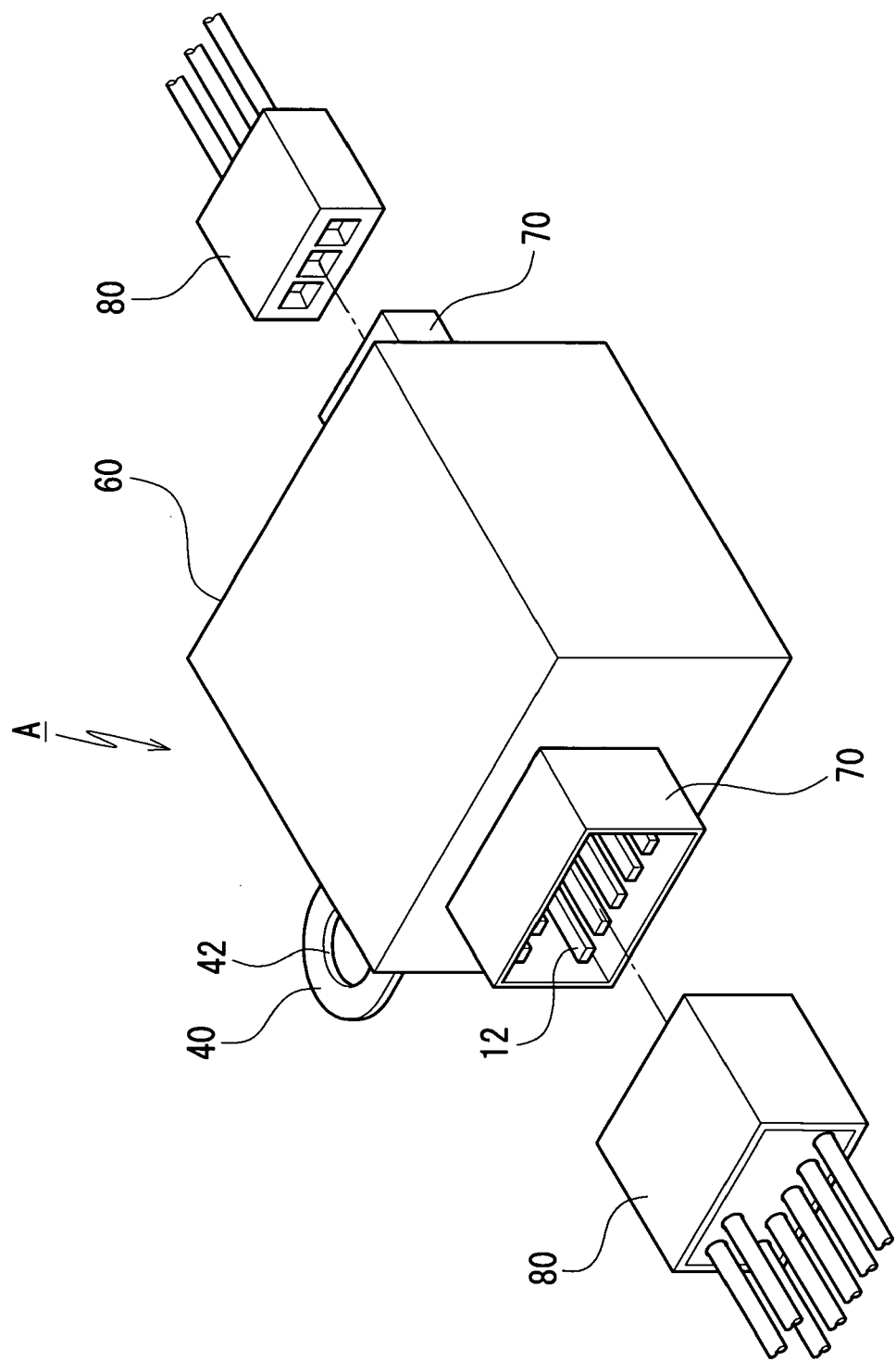
FIG. 4 is a schematic external perspective view showing connections between the joint part A and outside connectors.

Next, a description of a specific example of the structure of the joint part A will be provided. FIGS. 2 to 4 are schematic views showing the structure of the joint part A and the process of assembling the joint part A.

FIG. 2 is a view showing an example of the state of the joint part A before the first joint portion 10, the second joint portion 20, the ground terminal 40 and the noise filter 50 to be included in the housing 60 are assembled.

The first joint portion 10 is preferably formed by punching an electrically conductive plate material such as a metallic material, and has a plurality of pin terminals 12. In the preferred embodiment of the present invention, the number of pin terminals 12 is seven. These pin terminals 12 are coupled at their base end so as to be in a conduction state. Mating terminals attached to ends of electric wires with the top ends of the pin terminals 12 allows a concurrent connection of the electric wires.

The second joint portion 20 is also preferably formed by punching an electrically conductive plate material, and has a plurality of pin terminals 12. In the preferred embodiment of the present invention, the number of pin terminals 12 is three. These pin terminals 12 are coupled at their base end so as to be in a conduction state. Electric wires are connected to the top ends of the pin terminals 12 via terminals, and are brought into a conduction state at the base end of the pin terminals 12 so as to be brought into the concurrent connection.

The number of pin terminals 12 provided to each of the first joint portion 10 and the second joint portion 20 is not limited to the above mentioned number, and it is not necessary to make the number of pin terminals 12 correspond to the number of electric wires to be connected thereto. For example, it is preferable that the number of pin terminals 12 is larger than necessary for the engine control system so that electric wires which are drawn from other than the engine control system and to be connected to the ground are connected to the extra pin terminals 12. It is also preferable that the number of electric wires to be brought into the concurrent connection is smaller than the number of pin terminals 12, and the extra pin terminals 12 are not used.

Owing to the configuration that the joint part A has the first joint portion 10 and the second joint portion 20 each having the plurality of pin terminals 12 to which the electric wires are connected, and the pin terminals 12 are coupled at their base end so as to be in a conduction state, conventional complicated work of putting together and connecting the ends of the electric wires becomes unnecessary, so that connection work is simplified.

The ground terminal 40 is also preferably formed by punching an electrically conductive plate material and has the shape of a substantially square plate. On one end of the ground terminal 40, an engaging hole 42 used for making the connection to the ground such as the car body is provided, and on the other end of the ground terminal 40, the second joint portion 20 which is formed by cutting and bending is provided at a side portion of the ground terminal 40 so as to be integral with the ground terminal 40.

Accordingly, the second joint portion 20 is directly connected to the ground terminal 40, and the electric wires to be connected to the pin terminals 12 of the second joint portion 20 are also directly connected to the ground terminal 40.

While the ground terminal 40 and the second joint portion 20 are integrally formed in the example shown in FIGS. 2 to 4, they may be separately formed and then connected.

In the middle of the side portion of the ground terminal 40, a connection piece 44 is provided in a standing manner, to which an electrode 52 of the noise filter 50 is connected.

For the noise filter 50, a capacitor such as an electrolytic capacitor, a film capacitor and a chip capacitor is suitably used. The capacity needed for the capacitor depends on a voltage to be applied to the second joint portion 20, and the higher the applied voltage is, the larger the capacity needed for the capacitor is. Thus, a plurality of capacitors connected in series may be used. The joint part A shown in FIGS. 2 to 4 has a capacitor as the noise filter 50.

FIG. 3 is a schematic diagram showing the state of the joint part A in which the above-described constituent elements are assembled and housed in the housing 60.

The connection piece 44 of the ground terminal 40 which is formed by cutting and bending is connected to the electrode 52 of the capacitor 50, and the first joint portion 10 is connected to an electrode 54 of the capacitor 50. The first joint portion 10 is placed so as not to be brought into direct contact with the ground terminal 40. Accordingly, the first joint portion 10 is connected to the ground terminal 40 via the noise filter 50.

The first joint portion 10, the second joint portion 20, the ground terminal 40 and the noise filter 50 assembled and connected as mentioned above are housed in the housing 60.

The housing 60 which houses the first joint portion 10, the second joint portion 20, the ground terminal 40 and the noise filter 50 is made of an insulator such as a resin. On side walls of the housing 60, openings are provided, and the pin terminals 12 of the first joint portion 10 and the second joint portion 20, and the ground terminal 40 are inserted through the openings. The pin terminals 12 of the first joint portion 10 and the second joint portion 20 jut out of the openings so as to be connected to the electric wires, and the end of the ground terminal 40 juts out of the opening so as to be connected to the ground such as the car body.

In the housing 60, at least the capacitor 50 is subjected to enveloped casting of a resin to be molded. Alternatively, the housing 60 can be filled with a resin to be molded.

As mentioned above, because the noise filter 50 is included in the housing 60, work of routing and connecting the electric wires to the noise filter 50, which is necessary if the noise filter 50 is provided in the engine room, becomes unnecessary. Accordingly, connection workability can be improved.

Especially if the noise filter 50 is the capacitor, subjecting the capacitor 50 to enveloped casting of a resin to be molded in the housing 60 is preferable because it protects the capacitor 50 from extraneous moisture and offers stable capability of noise removal.

FIG. 4 is a schematic external perspective view of the joint part A.

To the housing 60, connector portions 70 arranged to surround the pin terminals 12 jutting from the side walls of the housing 60 are attached. To the ends of the electric wires to be connected to the pin terminals 12, terminals are attached preferably by crimping, to which connectors 80 are attached. Mating the connectors 80 with the connector portions 70 of the joint part A allows the pin terminals 12 of the first joint portion 10 and the second joint portion 20 to be mated with and connected to the terminals at the ends of the electric wires.

The connector portions 70 may be formed integrally with the side walls of the housing 60 by injection molding. Alternatively, the connector portions 70 may be formed separately from the housing 60 and then attached to the housing 60.

For the structure of the connector portions 70 and the mating and locking structure of the connector portions 70 and the connectors 80, conventional structures may be used, and detailed descriptions thereof are omitted.

By inserting a bolt or other element through the engaging hole 42 provided at the end of the ground terminal 40 so as to fasten the ground terminal 40 to a given portion in the engine room such as the car body, the ground terminal 40 is connected to the ground.

Just connecting the ground terminal 40 to the ground as mentioned above allows the first joint portion 10 to be connected to the ground via the noise filter 50 and the second joint portion 20 to be directly connected to the ground. Thus, work of connecting each of the first joint portion 10 and the second joint portion 20 to the ground becomes unnecessary, so that connection workability is improved.

When the ground terminal 40 is connected to the ground as mentioned above, the joint part A is fasten to the given portion in the engine room, so that connection work is further simplified.

In addition, making the connection to the ground by connecting both of the noise filter 50 provided to the wiring of the positive terminals of the igniters 3 and the injectors 4 and the wiring of the negative terminals of the igniters 3 and the injectors 4 to the ground terminal 40 could contribute to an improvement in noise removal effect.

Owing to the joint part A according to the first preferred embodiment of the present invention, the connection for providing the wiring of the engine control system shown in FIG. 1 can be made only by mating the connectors 80 with the connector portions 70. Thus, conventional complicated work of putting together the ends of the electric wires and welding and waterproofing them becomes unnecessary.

Figure 5:
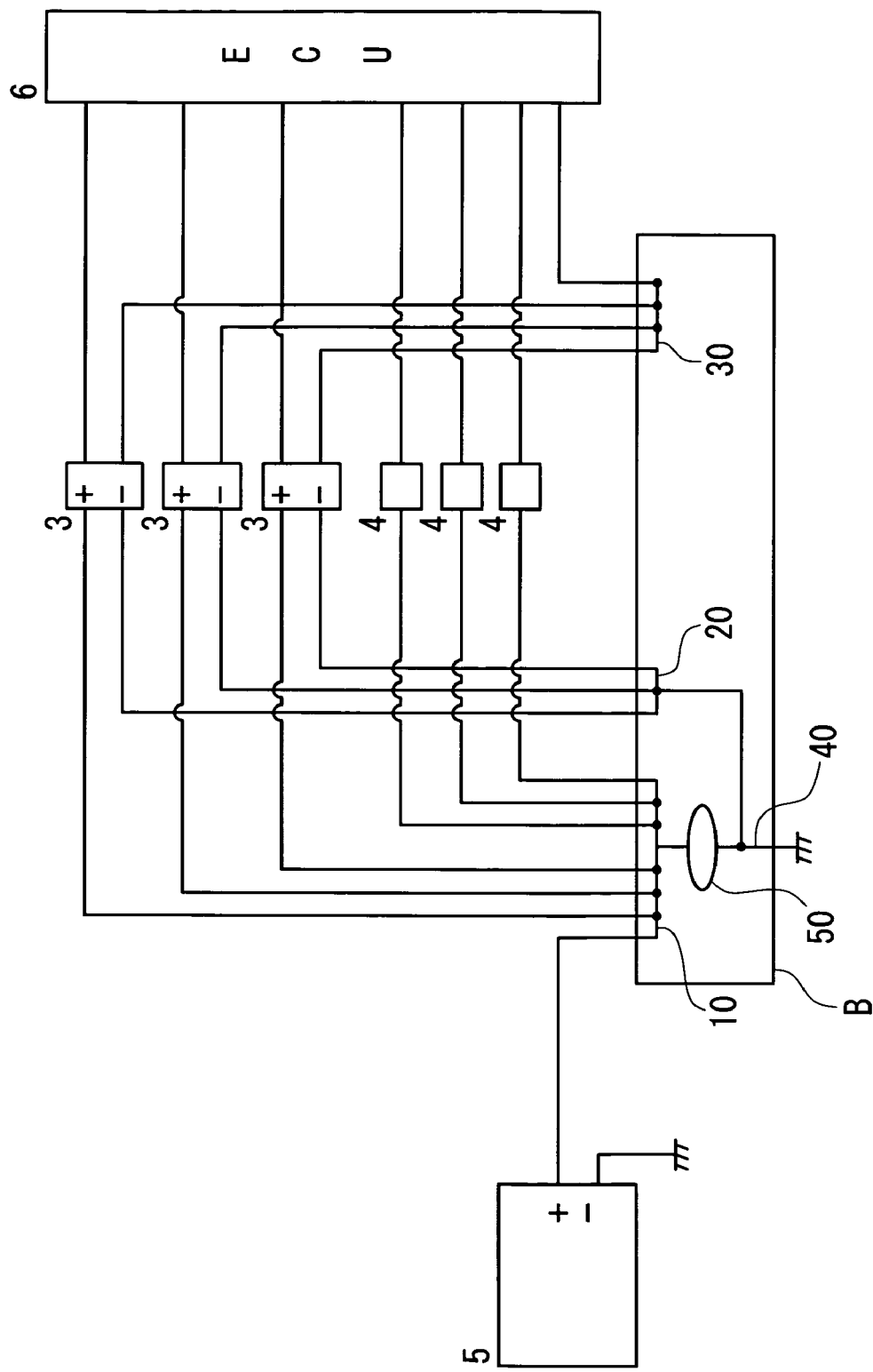
FIG. 5 is a schematic circuit diagram of an engine control system in which a joint part B according to a second preferred embodiment of the present invention is used.

Next, a detailed description of a second preferred embodiment of the present invention will be provided referring to FIGS. 5 to 9. FIG. 5 is a schematic circuit diagram showing an example of wiring of an engine control system intended for automobile use in which a joint part B according to the second preferred embodiment of the present invention is used. A circuit of the engine control system shown in FIG. 5 is substantially the same as that shown in FIG. 1. Only the structure of the joint part B is different, and the different point will be mainly described.

The joint part B has the first joint portion 10, the second joint portion 20, the ground terminal 40, the noise filter 50, and a third joint portion 30. The third joint portion 30 has the function of making a concurrent connection of electric wires which transmit returned signals for the control signals inputted to the igniters 3 from the ECU 6. The third joint portion 30 is not connected to the ground terminal 40.

Figure 7:
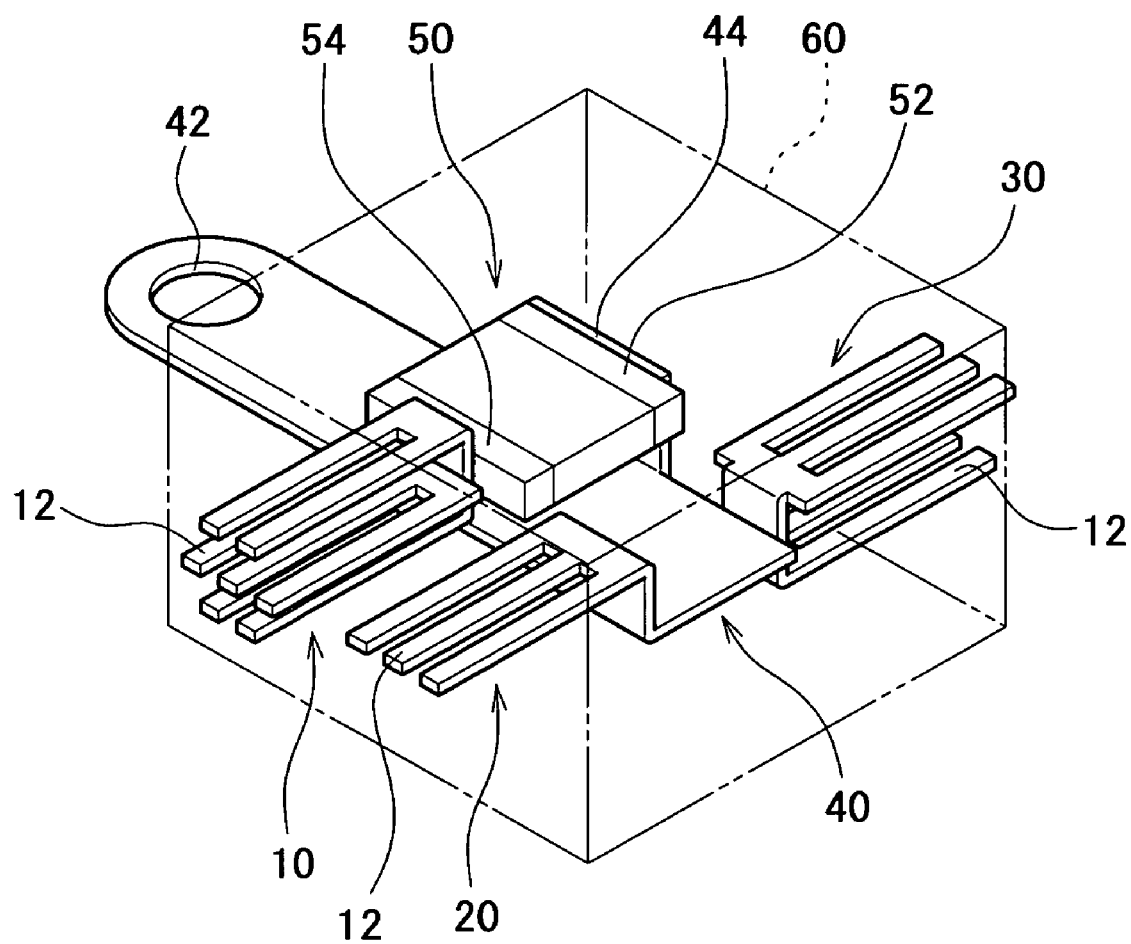
FIG. 7 is a schematic diagram showing the state of the joint part B after assembled.
Figure 8:
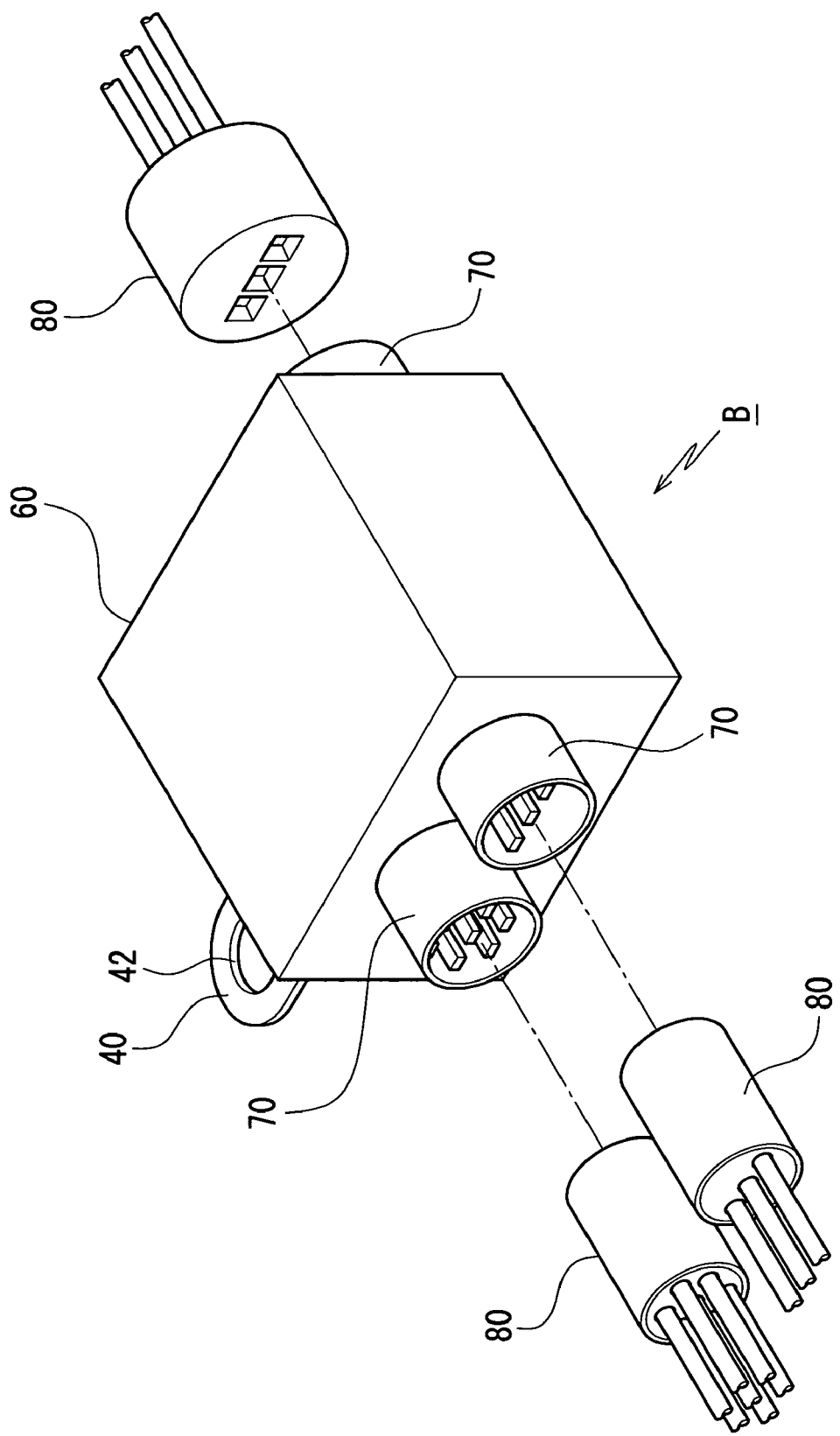
FIG. 8 is a schematic external perspective view showing connections between the joint part B and outside connectors.

Next, a description of a specific example of the structure of the joint part B will be provided. FIGS. 6 to 8 are schematic views showing the structure of the joint part B and the process of assembling the joint part B.

The first joint portion 10, the second joint portion 20, the ground terminal 40 and the noise filter 50 have substantially the same structures as those of the joint part A. In the joint part B shown in FIG. 6, the second joint portion 20 is placed adjacent to the first joint portion 10. As is the case with the joint part A, the second joint portion 20 is formed by cutting and bending and is provided at a side portion of the ground terminal 40 so as to be integral with the ground terminal 40, so that the second joint portion 20 is directly connected to the ground terminal 40.

The third joint portion 30 is preferably formed by punching an electrically conductive plate material such as a metallic material, and has a plurality of pin terminals 12. In the present preferred embodiment of the present invention, the number of pin terminals 12 is five. The pin terminals 12 are coupled at their base end so as to be in a conduction state. Mating terminals attached to ends of electric wires with the top ends of the pin terminals 12 allows a concurrent connection of the electric wires.

FIG. 7 is a schematic diagram showing the state of the joint part B in which the above-described constituent elements are assembled and housed in the housing 60.

The connection piece 44 of the ground terminal 40 which is formed by cutting and bending is connected to the electrode 52 of the capacitor 50, and the first joint portion 10 which is placed so as not to be brought into direct contact with the ground terminal 40 is connected to the electrode 54 of the capacitor 50. Thus, the first joint portion 10 is connected to the ground terminal 40 via the noise filter 50. The third joint portion 30 is placed so as not to be brought into direct contact with the ground terminal 40.

The first joint portion 10, the second joint portion 20, the third joint portion 30, the ground terminal 40 and the noise filter 50 assembled and connected as mentioned above are housed in the housing 60.

The housing 60 which houses the first joint portion 10, the second joint portion 20, the third joint portion 30, the ground terminal 40 and the noise filter 50 is made of an insulator such as a resin. On the side walls of the housing 60, openings are provided, and the pin terminals 12 of the first joint portion 10, the second joint portion 20 and the third joint portion 30, and the ground terminal 40 are inserted through the openings. The pin terminals 12 of the first joint portion 10, the second joint portion 20 and the third joint portion 30 jut out of the openings so as to be connected to the electric wires.

In the housing 60, at least the capacitor 50 is subjected to enveloped casting of a resin to be molded. Alternatively, the housing 60 can be filled with a resin to be molded.

FIG. 8 is a schematic external perspective view of the joint part B.

As is the case with the joint part A, the connector portions 70 are attached to the side walls of the housing 60. The connector portions 70 are arranged to surround the pin terminals 12 jutting from the side walls of the housing 60. To the ends of the electric wires to which the terminals are attached by crimping, the connectors 80 are attached. Mating the connectors 80 with the connector portions 70 of the joint part B allows the pin terminals 12 to be mated with and connected to the terminals at the ends of the electric wires.

For the structure of the connector portions 70 and the mating and locking structure of the connector portions 70 and the connectors 80, conventional structures may be used, and detailed descriptions thereof are omitted.

While the joint part A is an example of including two joint portions and the joint part B is an example of including three joint portions, the number of joint portions included in the joint part according to the preferred embodiments of the present invention is not specifically limited. It is essential only that the joint part has a plurality of joint portions, and some of the joint portions are directly connected to the ground terminal and the others are connected to the ground terminal via the noise filter.

Figure 9:
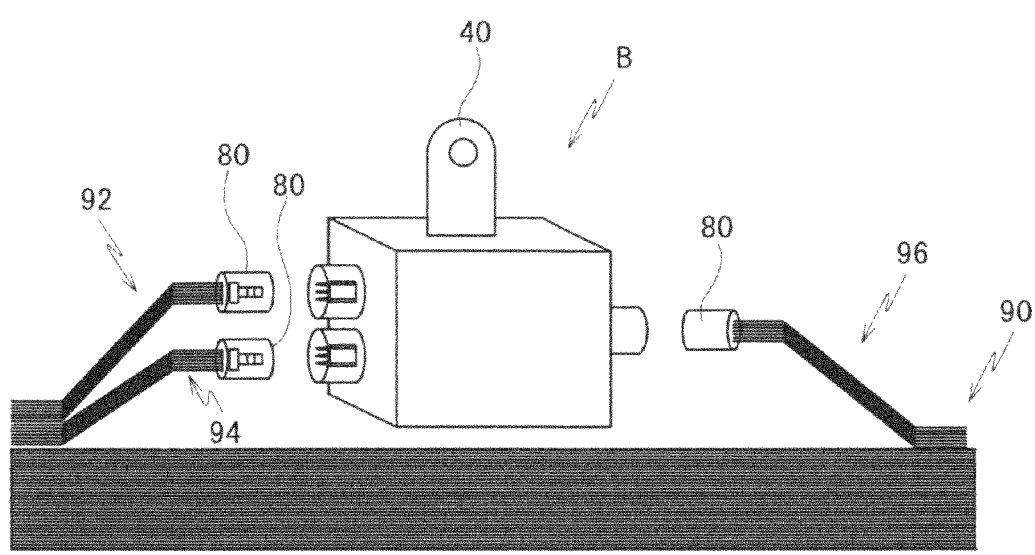
FIG. 9 is a schematic external view of a wiring harness with the joint part B.

FIG. 9 is a schematic external view of a wiring harness 90 using the joint part B.

The wiring harness 90 is made up of a plurality of electric wires. Wire bundles 92, 94 and 96 are branched from the wiring harness 90 so as to be brought into concurrent connections. The connectors 80 are connected to ends of the electric wires of the wire bundles 92, 94 and 96. To be specific, the wire bundle 92 branched from the wiring harness 90 includes electric wires drawn from the positive terminals of the igniters 3 and the injectors 4 and the positive terminal of the power supply 5, and the connector 80 is attached to ends of the electric wires. The wire bundle 94 branched from the wiring harness 90 includes electric wires drawn from the negative terminals of the igniters 3, and the connector 80 is attached to ends of the electric wires. The wire bundle 96 branched from the wiring harness 90 includes electric wires which transmit the returned signals for the control signals inputted to the igniters 3 from the ECU 6, and the connector 80 is attached to ends of the electric wires.

Just mating the connectors 80 with the connector portions 70 for the first joint portion 10, the second joint portion 20 and the third joint portion 30 of the joint part B allows the connection in the circuit shown in FIG. 5.

Figure 10:
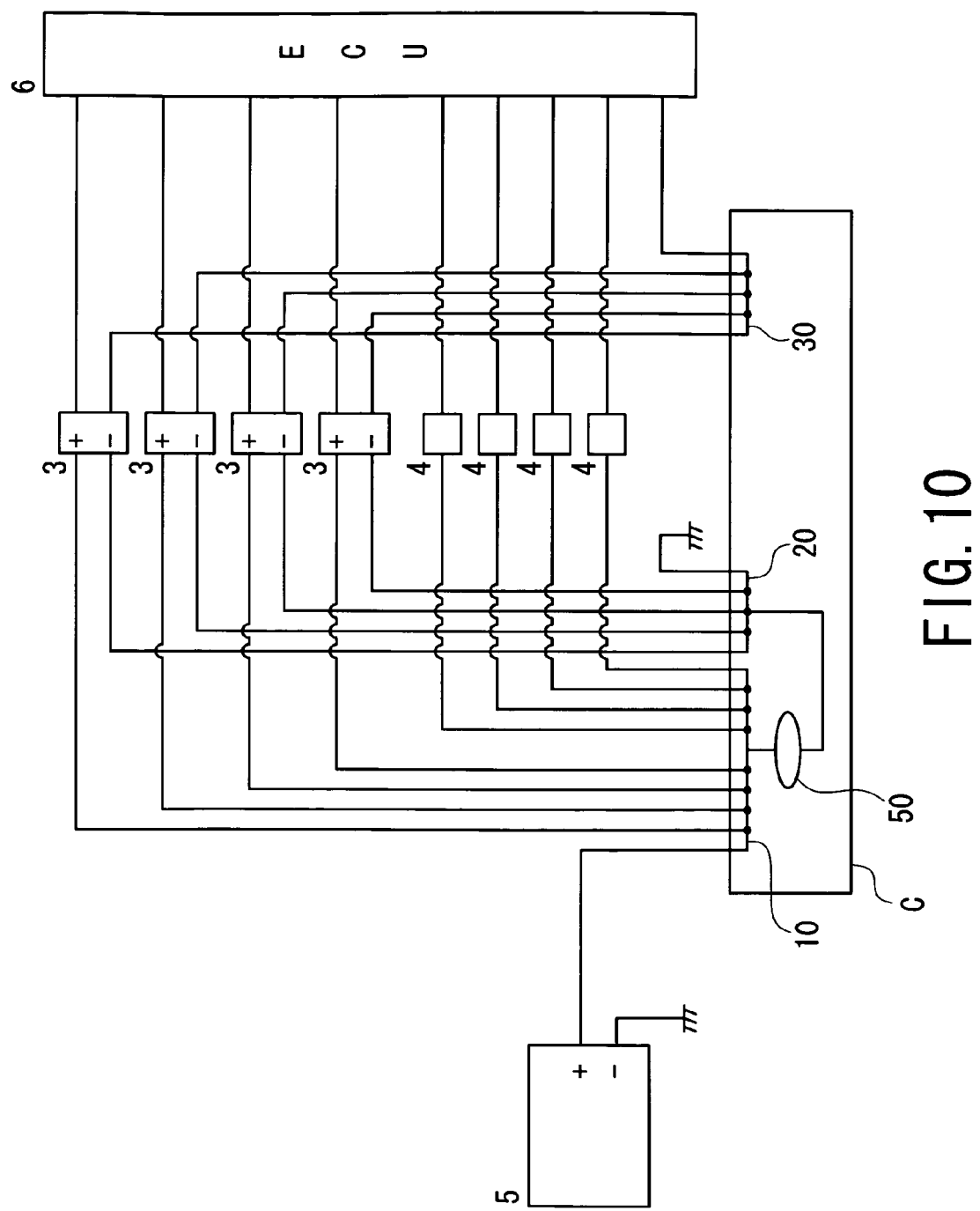
FIG. 10 is a schematic circuit diagram of an engine control system in which a joint part C according to a third preferred embodiment of the present invention is used.

Next, a detailed description of a third preferred embodiment of the present invention will be provided referring to FIGS. 10 to 15. FIG. 10 is a schematic circuit diagram showing an example of wiring of an engine control system intended for automobile use in which a joint part C according to the third preferred embodiment of the present invention is used. FIG. 10 shows an example of including four igniters 3 and four injectors 4.

The joint part C has the first joint portion 10, the second joint portion 20, the noise filter 50, and the third joint portion 30. The joint part C does not have such a ground terminal as included in the joint part A or the joint part B that has the engaging hole and is connected to the ground via screws.

The first joint portion 10 has the function of making a concurrent connection of the electric wires drawn from the positive terminal of the power supply 5 and the electric wires drawn from the positive terminals of the igniters 3 and the injectors 4. The second joint portion 20 has the function of making a concurrent connection of the electric wires drawn from the negative terminals of the igniters 3 and the electric wires drawn from the ground such as the car body. The third joint portion 30 has the function of making a concurrent connection of the electric wires which transmit the returned signals for the control signals inputted to the igniters 3 from the ECU 6.

The first joint portion 10 is connected to the second joint portion 20 via the noise filter 50. The third joint portion 30 is not connected to either of the first joint portion 10 and the second joint portion 20.

Figure 11:
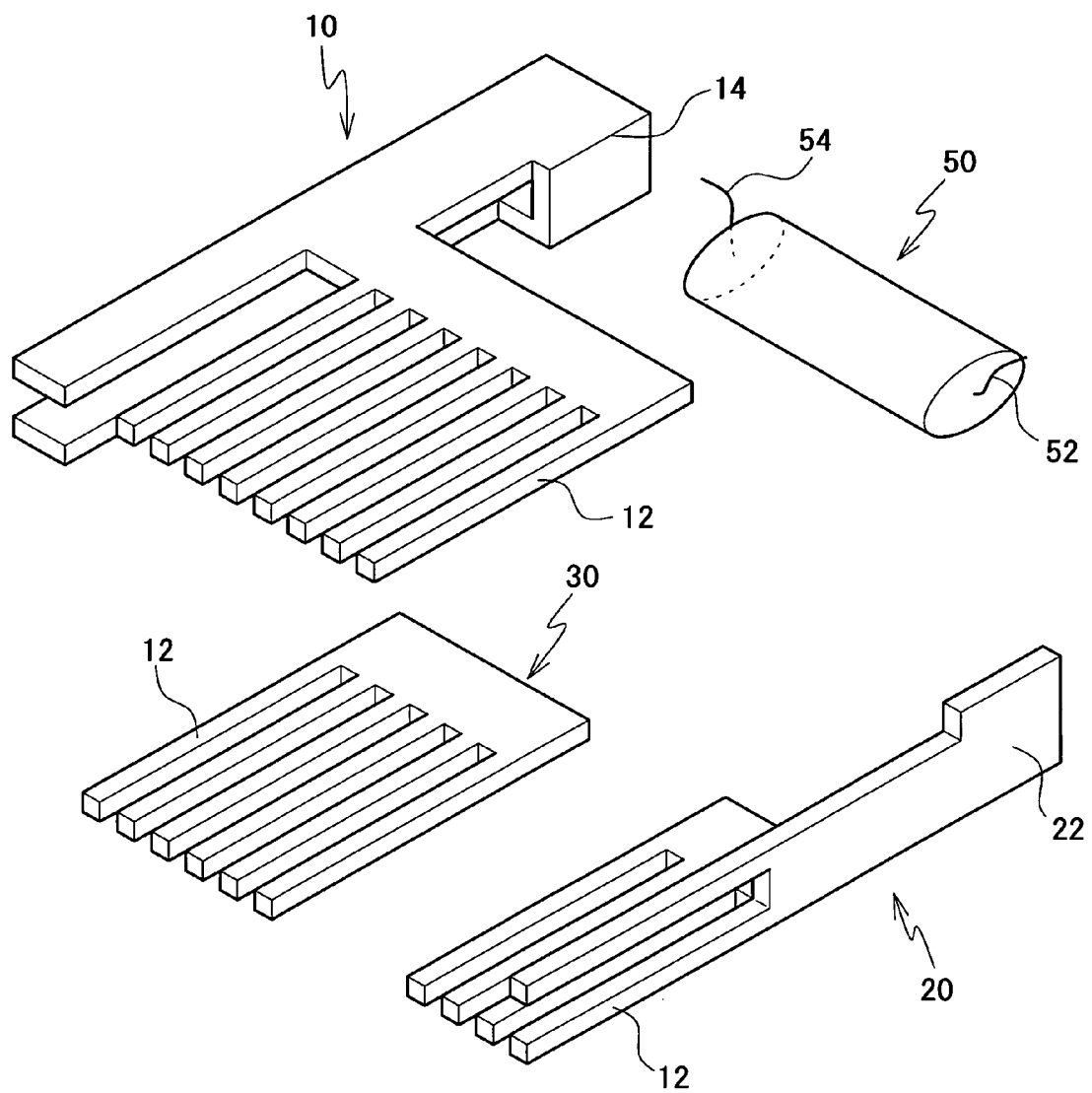
FIG. 11 is a diagram showing the state of the joint part C before assembled.

Next, a description of a specific example of the structure of the joint part C will be provided. FIG. 11 is a view showing an example of the state of the joint part C before the first joint portion 10, the second joint portion 20, the third joint portion 30 and the noise filter 50 are assembled. In the following descriptions, the top end side of the pin terminals 12 is regarded as the top end side of the joint part C as a whole, and the base end side of the pin terminals 12 is regarded as the base end side of the joint part C as a whole.

The first joint portion 10 is preferably formed by punching an electrically conductive plate material such as a metallic material, and has a plurality of pin terminals 12. In the present preferred embodiment of the present invention, the number of pin terminals 12 is ten. The pin terminals 12 are arranged to be two-tiered in the vertical direction and coupled at their base end so as to be in a conduction state. A coupling portion 14 arranged to couple the pin terminal 12 in the upper tier and the pin terminals 12 in the lower tier is provided at the base end of the first joint portion 10. The coupling portion 14 doubles as a connecting portion for connecting the electrode 54 of the noise filter 50 to the first joint portion 10. Mating terminals attached to ends of electric wires with the top ends of the pin terminals 12 allows a concurrent connection of the electric wires.

The second joint portion 20 is also preferably formed by punching an electrically conductive plate material such as a metallic material, and has a plurality of pin terminals 12. In the present preferred embodiment of the present invention, the number of pin terminals 12 is five. The pin terminals 12 are coupled at their base end so as to be in a conduction state. A side portion of the second joint portion 20 is bent so as to form a connecting portion 22 arranged to connect the electrode 52 of the noise filter 50 to the second joint portion 20. Electric wires are connected to the top ends of the pin terminals 12 via terminals, and are brought into a conduction state at the base end of the pin terminals 12 so as to be brought into the concurrent connection.

The third joint portion 30 is preferably formed by punching an electrically conductive plate material such as a metallic material, and has a plurality of pin terminals 12. In the present preferred embodiment of the present invention, the number of pin terminals 12 is six. The pin terminals 12 are coupled at their base end so as to be in a conduction state. Mating terminals attached to ends of electric wires with the top ends of the pin terminals 12 allows a concurrent connection of the electric wires.

The number of pin terminals 12 provided to each of the first joint portion 10, the second joint portion 20 and the third joint portion 30 is not limited to the above mentioned number, and it is not necessary to make the number of pin terminals 12 correspond to the number of electric wires to be connected thereto. For example, it is preferable that the number of pin terminals 12 is larger than necessary for the engine control system so that electric wires which are drawn from other than the engine control system and are to be connected to the ground may be connected to the extra pin terminals 12. It is also preferable that the number of electric wires to be brought into the concurrent connection is smaller than the number of pin terminals 12, and the extra pin terminals 12 are not used.

Owing to the configuration that the joint part C has the first joint portion 10, the second joint portion 20 and the third joint portion 30, conventional complicated work of putting together and connecting the ends of the electric wires becomes unnecessary, so that connection work is simplified.

For the noise filter 50, a capacitor such as an electrolytic capacitor, a film capacitor and a chip capacitor is suitably used. FIG. 11 shows an example of using a film capacitor as the noise filter 50. The electrodes 52 and 54 in the form of a lead wire are drawn from the noise filter 50.

Figure 12:
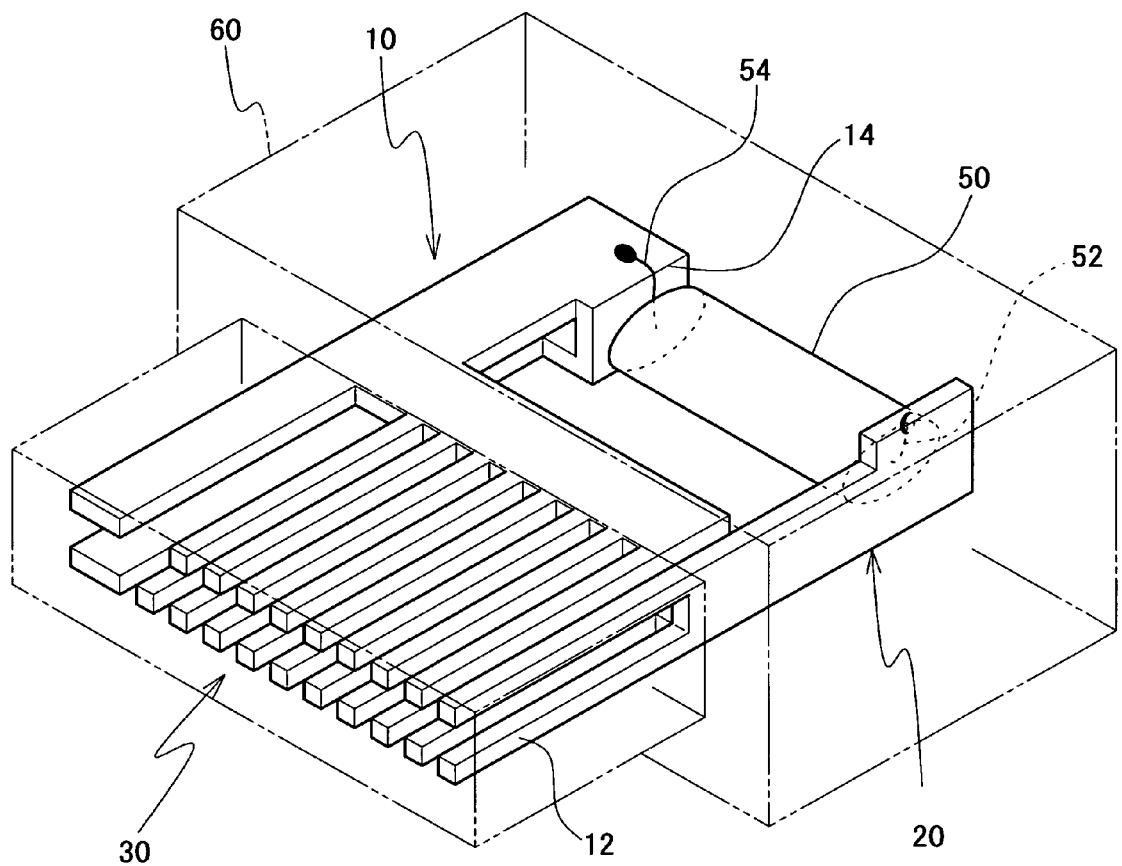
FIG. 12 is a schematic diagram showing the state of the joint part C after assembled.

FIG. 12 is a schematic view showing a state in which the first joint portion 10, the second joint portion 20, the third joint portion 30 and the noise filter 50 are included in the housing 60.

The connecting portion 22 of the second joint portion 20 is connected to the electrode 52 of the capacitor 50. The coupling portion 14 of the first joint portion 10 placed so as not to be brought into direct contact with the second joint portion 20 is connected to the electrode 54. Thus, the first joint portion 10 is connected to the second joint portion 20 via the noise filter 50. The third joint portion 30 is placed so as not to be brought into contact with either of the first joint portion 10 and the second joint portion 20.

Figure 13A:
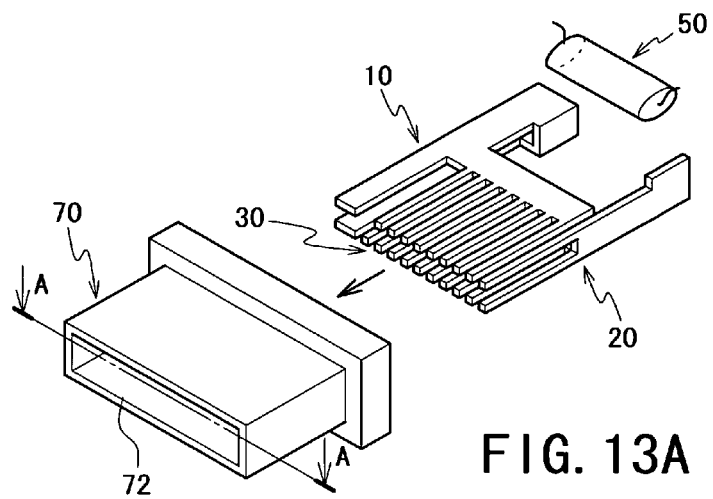
FIGS. 13A to 13C are schematic diagrams showing the process of assembling the joint part C.
Figure 13B:
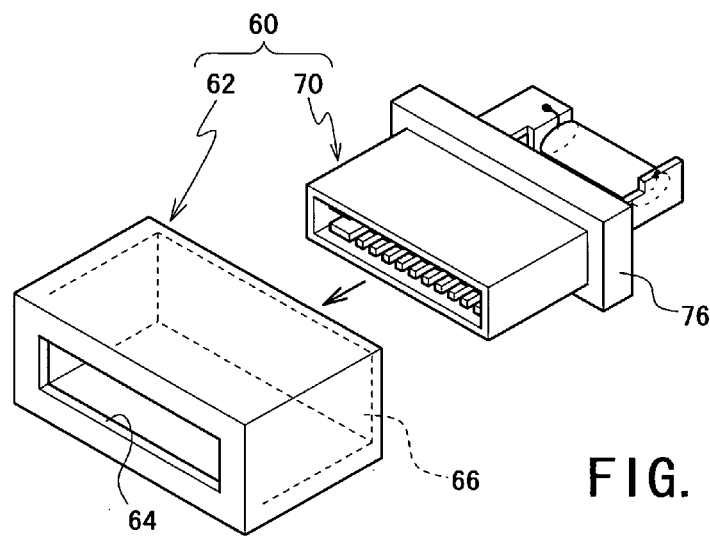
Figure 13C:
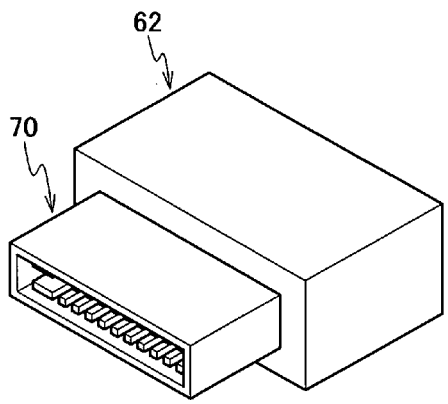
Figure 14:
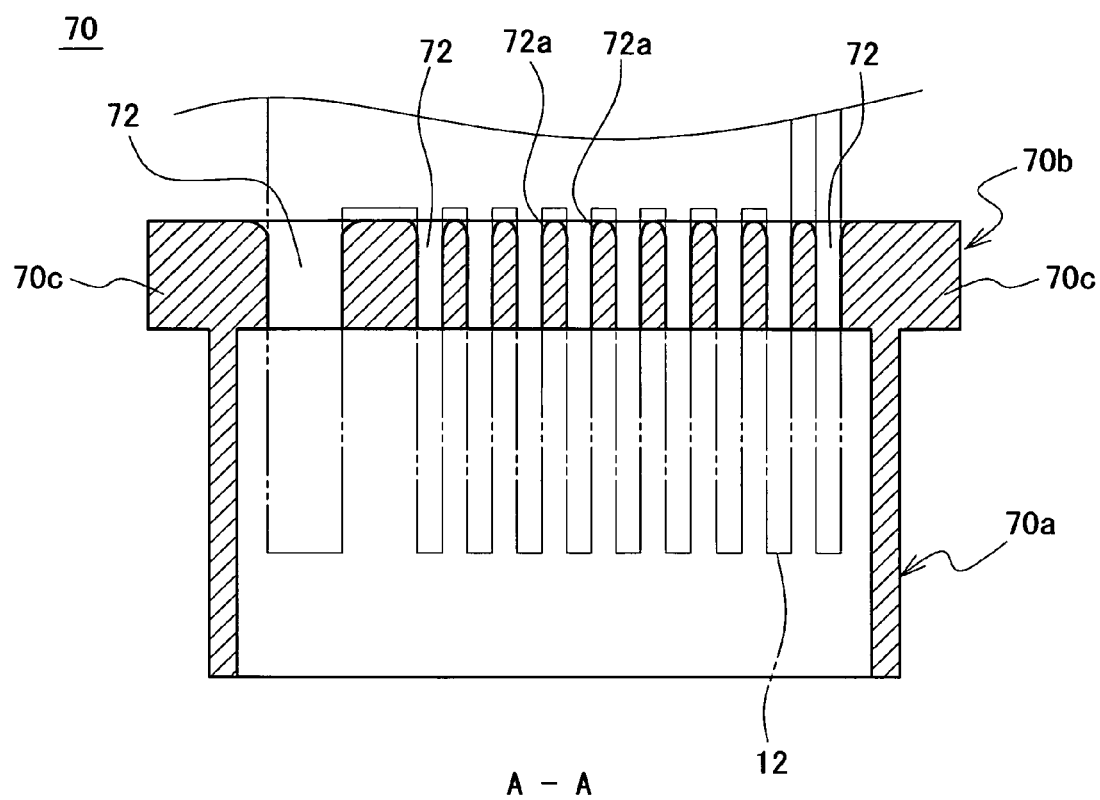
FIG. 14 is a sectional view of the connector portion 70 in A-A section of FIG. 13A.

FIGS. 13A to 13C are views showing the process of attaching the first joint portion 10, the second joint portion 20 and the third joint portion 30 to the housing 60 and connecting the noise filter 50 thereto so as to assemble the joint part C. FIG. 14 is a sectional view of the connector portion 70 in A-A section of FIG. 13A.

FIG. 13A is a view showing a state in which the first joint portion 10, the second joint portion 20 and the third joint portion 30 are to be press-fitted into the connector portion 70 from the base end side. The housing 60 consists of the connector portion 70 arranged to protect the pin terminals 12 of the first joint portion 10, the second joint portion 20 and the third joint portion 30 and guide them to be mated with counterpart terminals connected to the ends of the electric wires to be brought into the concurrent connection by those joint portions (see FIG. 13A), and a housing main body 62 arranged to house the connecting portions at the base ends of the first joint portion 10 and the second joint portion 20, the noise filter 50, and other constituent elements (see FIG. 13B). The housing main body 62 and the connector portion 70 are made of an insulator such as a resin.

A description of the structure of the connector portion 70 will be provided referring to FIGS. 13A to 14. In FIG. 14 showing the connector portion 70 in section A-A of FIG. 13A, the arrangement of the pin terminals 12 in a state where the first joint portion 10, the second joint portion 20 and the third joint portion 30 are press-fitted into the connector portion 70 is indicated by chain lines. The connector portion 70 has, at the top end side, a hood portion 70a having the shape of a squared cylinder with which a counterpart connector having a counterpart terminal is mated, and at the base end side, a terminal supporting portion 70b extending from the hood portion 70a. In the terminal supporting portion 70b, a plurality of press-fitting holes 72 are provided, into which the pin terminals 12 of the first joint portion 10, the second joint portion 20 and the third joint portion 30 are press-fitted so as to be supported.

The press-fitting holes 72 in the terminal supporting portion 70b have the shape of a squared hole in cross section which conforms to the shape of the pin terminals 12, and communicate with the interior of the hood portion 70a. The press-fitting holes 72 through which the pin terminals 12 are inserted are provided with, at the entrance side, tapered guides 72a which allow the pin terminals 12 to be easily press-fitted. In the present preferred embodiment of the present invention, the press-fitting holes 72 are arranged to be two-tiered. However, the arrangement of the press-fitting holes 72 may be varied according to the arrangement of the pin terminals 12.

When the pin terminals 12 are press-fitted into the connector portion 70 through the press-fitting holes 72, the first joint portion 10, the second joint portion 20 and the third joint portion 30 are inserted into the connector portion 70 until the base end of the pin terminals 12 reaches the base end face of the terminal supporting portion 70b, and the pin terminals 12 are placed in the hood portion 70a.

Figure 15:
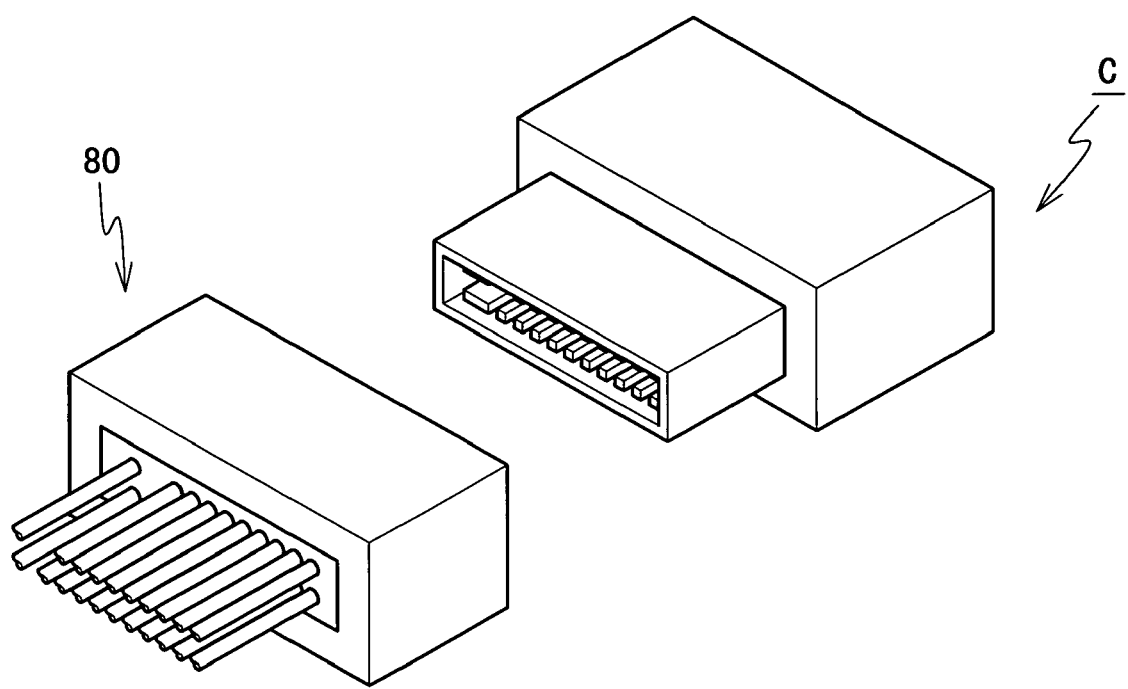
FIG. 15 is a schematic external perspective view showing connections between the joint part C and an outside connector.
Figure 16:
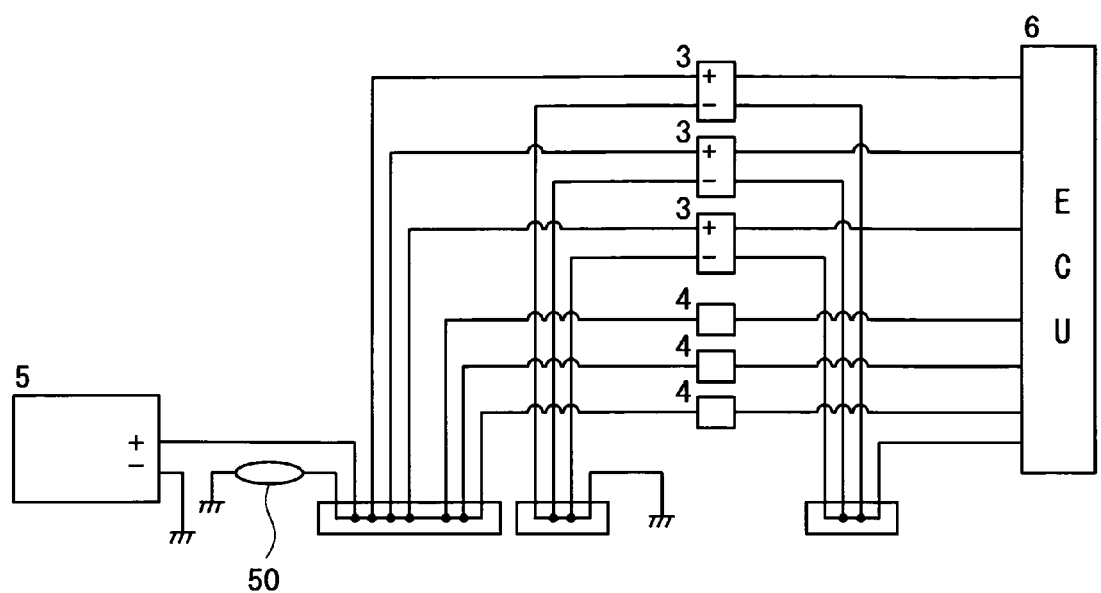
FIG. 16 is a schematic circuit diagram of a conventional engine control system intended for automobile use.
Figure 17:
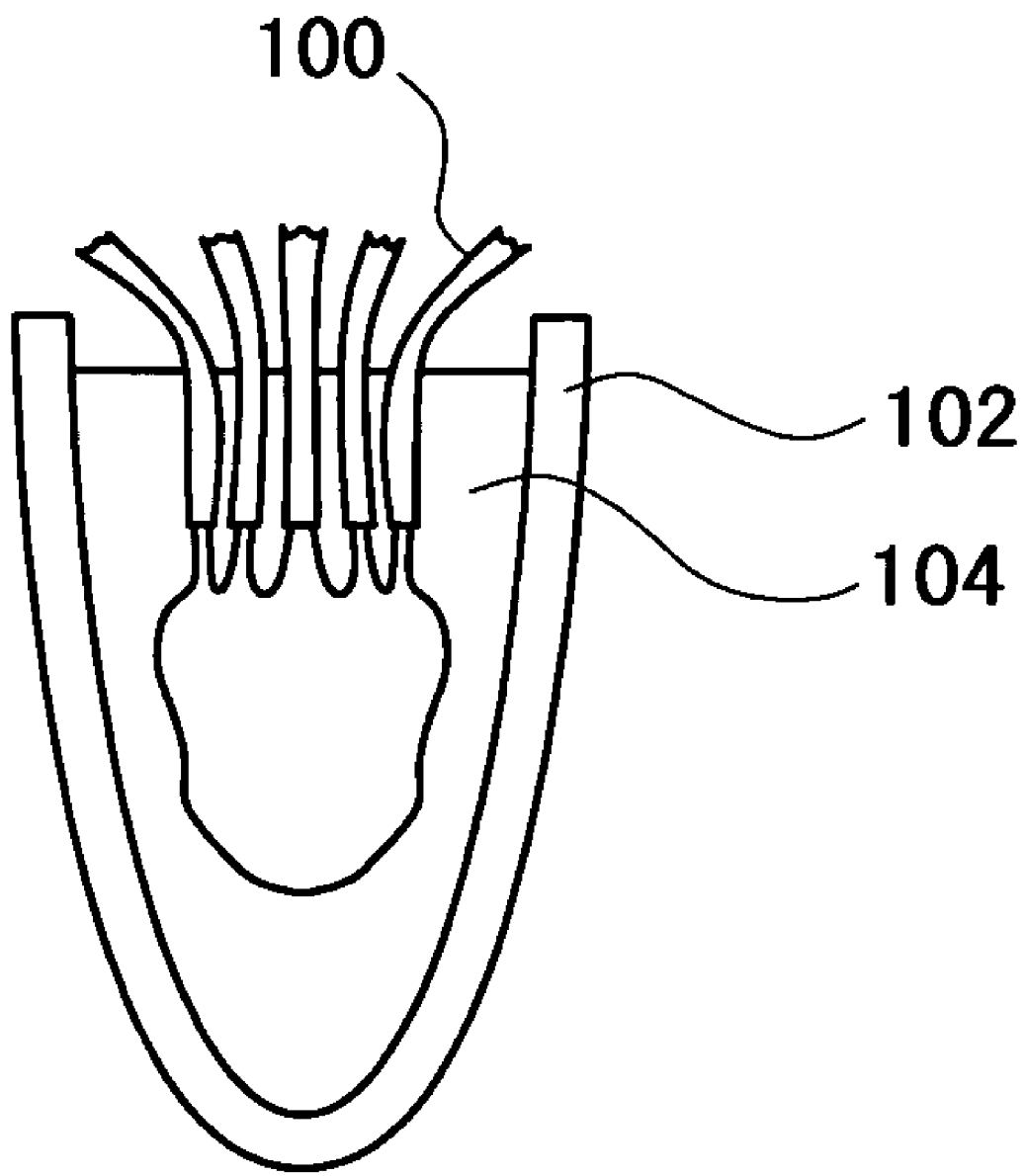
FIG. 17 is a view for illustrating a conventional manner of connecting electric wires.

The shape of the hood portion 70a conforms to the shape of the counterpart connector in order that the hood portion 70a may mate with the counterpart connector having the counterpart terminal which is connected to the ends of the electric wires to be brought into the concurrent connection by the capacitor-contained joint part C (see FIG. 15).

A flange 70c extending outward is provided to the outer rim of the terminal supporting portion 70b in order that the flange 70c may be locked by an inner wall surface of the housing main body 62 when the connector portion 70 is inserted into the housing main body 62. Incidentally, providing locking pieces or other mechanisms to the base ends of the pin terminals 12 can prevent the first joint portion 10, the second joint portion 20 and the third joint portion 30 from falling off the connector portion 70.

FIG. 13B is a view showing a state in which the capacitor 50 is being connected to the first joint portion 10 and the second joint portion 20 attached to the connector portion 70, and they are to be attached to the housing main body 62.

The housing main body 62 has openings 64 and 66 respectively on its two opposed surfaces, and the openings 64 and 66 have the shape of a substantial square such that the noise filter 50 and other constituent elements can be housed in the housing main body 62. The size of the opening 64 provided to the top end surface of the housing main body 62 is set such that the passage of the top end of the connector portion 70 is allowed while the passage of the flange 76 provided to the base end of the connector portion 70 is not allowed. The housing main body 62 is placed so that the first joint portion 10, the second joint portion 20 and the third joint portion 30 attached to the connector portion 70 are inserted through the opening 66, and the connector portion 70 juts out of the opening 64.

FIG. 13C is a view showing a state in which the connector portion 70 is being attached to the housing main body 62. By filling the housing main body 62 housing the first joint portion 10, the second joint portion 20, the third joint portion 30 and the noise filter 50 with a resin such as an epoxy resin to be molded, the first joint portion 10, the second joint portion 20, the third joint portion 30, the noise filter 50, and other constituent elements are fixed to the housing 60 and waterproofed.

FIG. 15 is a schematic perspective view showing a state in which the joint part C is to be mated with the counterpart connector connected to the ends of the electric wires to be brought into the concurrent connection by the joint part C.

The connector 80 is attached to the ends of the electric wires to which the terminals are attached by crimping, and mating the connector 80 with the connector portion 70 of the joint part C makes the pin terminals 12 and the terminals at the ends of the electric wires be mated with and connected to each other.

For the mating and locking structure of the connector portion 70 and the connector 80, conventional structure may be used, and a detailed description thereof is omitted.

At the positions in the connector 80 corresponding to the pin terminals 12 of the first joint portion 10, the terminal attached to the electric wire drawn from the positive terminal of the power supply 5 shown in FIG. 10 and the terminals attached to the electric wires drawn from the positive terminals of the igniters 3 and the injectors 4 shown in FIG. 10 are placed. At the positions in the connector 80 corresponding to the pin terminals 12 of the second joint portion 20, the terminals attached to the electric wires drawn from the negative terminals of the igniters 3 shown in FIG. 10 and the terminal attached to the electric wire drawn from the ground such as the car body are placed. At the positions in the connector 80 corresponding to the pin terminals 12 of the third joint portion 30, the terminals attached to the electric wires which transmit the returned signals for the control signals inputted to the igniters 3 from the ECU 6 shown in FIG. 10 are placed.

As mentioned above, just mating the connector 80 having the terminals attached to the ends of the electric wires drawn from the respective constituent elements with the connector portion 70 of the joint part C allows connections for providing such a circuit as shown in FIG. 10.

Owing to the joint part C, connecting the terminal attached to the end of the electric wire drawn from the ground and the pin terminals 12 of the second joint portion 20 allows the connection of the second joint portion 20 to the ground. Therefore, even if a space for the joint part C cannot be obtained in a ground connecting portion such as the car body, the second joint portion 20 can be connected to the ground.

As mentioned above, owing to the joint part according to the preferred embodiments of the present invention, the connection of the wiring of the engine control system shown in FIG. 1, 5 or 10 can be made by just mating the joint part with the connector. Therefore, conventional complicated work of putting together the ends of the electric wires and welding and waterproofing them becomes unnecessary, so that connection work is made more efficient.

The foregoing description of the preferred embodiments of the invention is not intended to be exhaustive or to limit the invention to the precise form disclosed, and modifications and variations are possible in the light of the above teachings or may be acquired from practice of the invention. For example, the arrangement of the first joint portion, the second joint portion, the ground terminal and the noise filter, the number of pin terminals and the arrangement of them, and other factors can be varied as necessary.

INDUSTRIAL APPLICABILITY

The joint part according to the preferred embodiments of the present invention facilitates connection of the wiring harness and improves connection workability. Thus, the joint part is suitably used in the wiring connections around the engine of the automobile.

The invention claimed is:

1. A joint part comprising:
    a housing comprising:
        a first joint portion arranged to make a concurrent connection of ends of electric wires drawn from positive terminals of a plurality of ignition mechanisms and positive terminals of a plurality of fuel injection mechanisms and an end of an electric wire drawn from a positive terminal of a power supply for the mechanisms;
        a second joint portion arranged to make a concurrent connection of ends of electric wires drawn from negative terminals of the ignition mechanisms;
        a ground terminal to which ends of electric wires drawn from a ground are connected; and
        a noise filter disposed in the housing and connected between the ground terminal and the first joint portion,
    wherein in the housing, the second joint portion is connected between the noise filter and the ground terminal.

2. A joint part comprising:
    a housing comprising:
        a first joint portion arranged to make a concurrent connection of ends of electric wires drawn from positive terminals of a plurality of ignition mechanisms and positive terminals of a plurality of fuel injection mechanisms and an end of an electric wire drawn from a positive terminal of a power supply for the mechanisms; and
        a second joint portion arranged to make a concurrent connection of ends of electric wires drawn from negative terminals of the ignition mechanisms and an end of an electric wire drawn from a ground; and
        a noise filter disposed in the housing and connected between the first joint portion and the second joint portion.

3. The joint part according to claim 1, wherein the housing further comprises a third joint portion arranged to make a concurrent connection of ends of electric wires which transmit returned signals for control signals inputted to the ignition mechanisms from a control device which controls the ignition timing of the ignition mechanisms.

4. The joint part according to claim 1, wherein at least the noise filter is subjected to enveloped casting of a resin to be molded.

5. A wiring harness comprising the joint part according to claim 1.

6. The joint part according to claim 2, wherein the housing further comprises a third joint portion arranged to make a concurrent connection of ends of electric wires which transmit returned signals for control signals inputted to the ignition mechanisms from a control device which controls the ignition timing of the ignition mechanisms.

7. The joint part according to claim 2, wherein at least the noise filter is subjected to enveloped casting of a resin to be molded.

8. The joint part according to claim 3, wherein at least the noise filter is subjected to enveloped casting of a resin to be molded.

9. The joint part according to claim 6, wherein at least the noise filter is subjected to enveloped casting of a resin to be molded.

10. A wiring harness comprising the joint part according to claim 2.

11. A wiring harness comprising the joint part according to claim 3.

12. A wiring harness comprising the joint part according to claim 6.

13. A wiring harness comprising the joint part according to claim 4.

14. A wiring harness comprising the joint part according to claim 7.

15. A wiring harness comprising the joint part according to claim 8.

16. A wiring harness comprising the joint part according to claim 9.

* * * * *